(12) United States Patent
Jaiswal et al.

(10) Patent No.: US 11,468,146 B2
(45) Date of Patent: Oct. 11, 2022

(54) ARRAY OF INTEGRATED PIXEL AND MEMORY CELLS FOR DEEP IN-SENSOR, IN-MEMORY COMPUTING

(71) Applicant: GLOBALFOUNDRIES U.S. Inc., Santa Clara, CA (US)

(72) Inventors: Akhilesh Jaiswal, Ballston Spa, NY (US); Ajey Poovannummoottil Jacob, Watervliet, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 450 days.

(21) Appl. No.: 16/705,434

(22) Filed: Dec. 6, 2019

(65) Prior Publication Data
US 2021/0173894 A1 Jun. 10, 2021

(51) Int. Cl.
*G11C 11/408* (2006.01)
*G06F 17/16* (2006.01)
(Continued)

(52) U.S. Cl.
CPC .......... *G06F 17/16* (2013.01); *G11C 11/4085* (2013.01); *G11C 11/4094* (2013.01);
(Continued)

(58) Field of Classification Search
CPC ............ G11C 11/4085; G11C 11/4094; G11C 13/0002; G11C 17/06; G11C 11/403;
(Continued)

(56) References Cited

U.S. PATENT DOCUMENTS

| 6,914,227 B2 | 7/2005 | Kaifu et al. |
| 7,119,745 B2 | 10/2006 | Gaucher et al. |
| (Continued) | | |

FOREIGN PATENT DOCUMENTS

| WO | 95/06288 A2 | 3/1995 |
| WO | 2011/133693 A2 | 10/2011 |

OTHER PUBLICATIONS

U.S. Appl. No. 16/801,458, Notice of Allowance dated Aug. 24, 2021, pp. 1-8.
(Continued)

*Primary Examiner* — Mushfique Siddique
(74) *Attorney, Agent, or Firm* — Anthony Canale

(57) ABSTRACT

Disclosed are embodiments of an integrated circuit structure (e.g., a processing chip), which includes an array of integrated pixel and memory cells configured for deep in-sensor, in-memory computing (e.g., of neural networks). Each cell incorporates a memory structure (e.g., DRAM structure or a ROM structure) with a storage node, which stores a first data value (e.g., a binary weight value), and a sensor connected to a sense node, which outputs a second data value (e.g., an analog input value). Each cell is selectively operable in a functional computing mode during which the voltage level on a bit line is adjusted as a function of both the first data value and the second data value. Each cell is further selectively operable in a storage node read mode. Furthermore, depending upon the type of memory structure (e.g., a DRAM structure), each cell is selectively operable in a storage node write mode.

20 Claims, 13 Drawing Sheets

(51) Int. Cl.
  *H01L 27/108* (2006.01)
  *H01L 27/146* (2006.01)
  *G11C 11/4094* (2006.01)
  *G11C 17/06* (2006.01)
  *G11C 13/00* (2006.01)
  *G06N 3/063* (2006.01)

(52) U.S. Cl.
  CPC .......... *G11C 13/0002* (2013.01); *G11C 17/06* (2013.01); *H01L 27/10805* (2013.01); *H01L 27/14612* (2013.01); *H01L 27/14643* (2013.01); *G06N 3/063* (2013.01)

(58) Field of Classification Search
  CPC . G11C 11/4091; G11C 11/4096; G11C 11/54; G11C 17/10; G11C 7/1006; H01L 27/10805; H01L 27/14612; H01L 27/14643; G06N 3/063; G06N 3/0454; G06N 3/0635
  See application file for complete search history.

(56) References Cited

U.S. PATENT DOCUMENTS

| | | | |
|---|---|---|---|
| 7,514,716 B2 | 4/2009 | Panicacci | |
| 7,692,130 B2 | 4/2010 | Abadeer | |
| 7,952,635 B2 | 5/2011 | Lauxtermann | |
| 8,018,384 B2 | 9/2011 | Floyd et al. | |
| 8,184,188 B2 | 5/2012 | Yaghmai | |
| 8,638,377 B2 | 1/2014 | Shoyama | |
| 8,816,929 B2 | 8/2014 | Kam et al. | |
| 9,041,694 B2 | 5/2015 | Nurmi et al. | |
| 9,635,291 B2 | 4/2017 | Uchida | |
| 9,848,141 B2 | 12/2017 | Panicacci et al. | |
| 9,998,721 B2 | 6/2018 | Rivard et al. | |
| 10,127,964 B2 | 11/2018 | Sun et al. | |
| 10,147,367 B2 | 12/2018 | Tan et al. | |
| 10,182,197 B2 | 1/2019 | Feder et al. | |
| 10,375,369 B2 | 8/2019 | Rivard et al. | |
| 11,069,402 B1* | 7/2021 | Jaiswal | G11C 16/0408 |
| 2010/0051784 A1 | 3/2010 | Parks | |
| 2010/0238310 A1* | 9/2010 | Shizukuishi | H01L 27/14643 348/308 |
| 2012/0038604 A1 | 2/2012 | Liu et al. | |
| 2012/0212384 A1 | 8/2012 | Kam et al. | |
| 2013/0075593 A1 | 3/2013 | Williams, Jr. | |
| 2014/0198072 A1 | 7/2014 | Schuele et al. | |
| 2018/0005588 A1 | 1/2018 | Kurokawa | |
| 2018/0167575 A1 | 6/2018 | Watanabe et al. | |
| 2018/0366476 A1 | 12/2018 | Liu | |
| 2019/0363118 A1* | 11/2019 | Berkovich | H01L 27/14605 |
| 2020/0195875 A1 | 6/2020 | Berkovich et al. | |

OTHER PUBLICATIONS

Merkel, Jordan, "FeFET Process Integration and Characterization," 37th Annual Microelectronic Engineering Conference, 2019, pp. 1-6.
McGlone, Joseph F., "Ferroelectric HfO2 Thin Films for FeFET Memory Devices," 34th Annual Microelectronic Engineering Conference, 2016, pp. 1-6.
U.S. Appl. No. 16/820,801, Notice of Allowance dated Apr. 16, 2021, pp. 1-8.
Coath et al., "Advanced Pixel Architectures for Scientific Image Sensors", Research Gate, 2009, pp. 57-61, https://www.researchgate.net/publication/265117870.
George et al., "Nonvolatile Memory Design Based on Ferroelectric FETs", 53nd ACM/EDAC/IEEE Design Automation Conference (DAC), IEEE, 2016, pp. 1-6.
Krestinskaya et al., "Real-time Analog Pixel-to-pixel Dynamic Frame Differencing with Memristive Sensing Circuits", IEEE Sensors, 2018, pp. 1-4.
Lee et al., "R-MRAM: A ROM-Embedded STT MRAM Cache", IEEE Electron Device Letters, vol. 34, No. 10, 2013, pp. 1256-1258.
Long et al., "A Ferroelectric FET Based Processing-in-Memory Architecture for DNN Acceleration", IEEE Journal on Exploratory Solid-State Computational Devices and Circuits, 2019, pp. 1-7.
Olumodeji et al., "Memristor-Based Pixel for Event-Detection Vision Sensor", IEEE Sensors, 2015, pp. 1-4.
Smagulova et al., "CMOS-Memristor Hybrid Integrated Pixel Sensors", IEEE International Symposium on Nanoelectronic and Information Systems (iNIS), 2016, pp. 34-37.
Tsai et al., "A Two-Step Readout CMOS Image Sensor Active Pixel Architecture", IEEE Sensors, 2011, pp. 1941-1945.
Vu et al., "Evaluation of 10MeV Proton Irradiation on 5.5 Mpixel Scientific CMOS Image Sensor", SPIE Remote Sensing Europe, vol. 7826, 2010, pp. 1-8.
Zhang et al., "Compact all-CMOS Spatiotemporal Compressive Sensing Video Camera with Pixel-Wise Coded Exposure", Optics Express, vol. 24, No. 8, 2016, pp. 9013-9024.
U.S. Appl. No. 16/801,458, Office Action Communication dated Jun. 28, 2021, pp. 1-8.

* cited by examiner

ARRAY OF INTEGRATED PIXEL AND MEMORY CELLS FOR DEEP IN-SENSOR, IN-MEMORY COMPUTING

BACKGROUND

Field of the Invention

The present invention relates to complex computing applications (e.g., cognitive computing applications) and, more particularly, to an array of integrated pixel and memory cells configured for deep in-sensor, in-memory computing.

Description of Related Art

More specifically, image and voice processing applications typically employ cognitive computing and, particularly, neural networks (NNs) for recognition and classification. Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. However, processors with hardware-implemented NN's have been developed to increase processing speed. One disadvantage of processors with hardware-implemented NNs is that they are discrete processing units. For example, a processor with a hardware-implemented NN is typically physically separated from the pixel array that captures the input data (i.e., the processor and the pixel array are in different consumer electronic devices or different chips within the same device). As a result, the data from the pixel array must be uploaded to the processor prior to performing any cognitive computing.

SUMMARY

Generally, disclosed herein embodiments of an integrated circuit (IC) structure (i.e., a processing chip) that includes an array of integrated pixel and memory cells configured for deep in-sensor, in-memory computing (e.g., of neural networks). The cells can be arranged in columns and rows. Each cell can include a select transistor, which has a gate electrically connected to a word line and a source region electrically connected to a bit line. Each cell can further include a memory structure (e.g., a dynamic random access memory (DRAM) structure, a read only memory (ROM) structure or some other suitable memory structure) with a storage node, which is operably connected to the select transistor and which stores a first data value. Each cell can further include a pixel. The pixel can include a storage node, which is operably connected to the select transistor, and a photodiode, which is electrically connected to the sense node.

Each cell is selectively operable in a functional computing mode. During the functional computing mode in a specific cell in a specific row and a specific column, the photodiode of the specific cell can perform a light sensing process resulting in a second data value being output on the sense node. Additionally, a specific word line for the specific row can be activated (i.e., switched to a high voltage state) causing the select transistor of the specific cell to switch to an ON state and automatically adjust a bit line voltage on a specific bit line for the specific column as a function of both the first data value stored in the specific cell and the second data value sensed by the specific cell. Each cell is further selectively operable in a storage node read mode. During the storage node read mode of the specific cell, the first data value stored in the storage node of that specific cell can be read out. Furthermore, depending upon the type of memory structure (e.g., a DRAM structure), each cell can further be selectively operable in a storage node write mode. During the storage node write mode of the specific cell, the first data value can be written to the storage node of the specific cell.

One embodiment of the IC structure can include an array of integrated pixel and dynamic random access memory (DRAM) cells configured for deep in-sensor, in-memory computing (e.g., of neural networks (NNs)). The cells can be arranged in columns and rows. Each cell can include a select transistor. Each cell can further include a DRAM structure with an access transistor and a storage node and, particularly, a capacitor, which is operably connected to the select transistor and which stores a first data value. Each cell can further include a pixel. The pixel can include a sense node, which is operably connected to the select transistor, and a photodiode, which is electrically connected to the sense node.

The IC structure can further include first and second word lines for the rows of cells, respectively, and first and second bit lines for the columns of cells, respectively. Each first word line can be electrically connected to the gates of the select transistors of all of the cells in a corresponding row. Each first bit line can be electrically connected to the source regions of the select transistors of all of the cells in a corresponding column. Each second word line can be electrically connected to the gates of the access transistors in the DRAM structures of all of the cells in a corresponding row and each second bit line can be electrically connected to the source regions of the access transistors in the DRAM structures of all of the cells in a corresponding column.

Each cell is selectively operable in a functional computing mode. During the functional computing mode in a specific cell in a specific row and a specific column, the photodiode can perform a light sensing process that results in a second data value being output on the sense node. Additionally, a specific first word line for the specific row can be activated causing the select transistor of the specific cell to switch to an ON state and automatically adjust a bit line voltage on a specific first bit line for the specific column as a function of both the first data value stored in the specific cell and the second data value sensed by the specific cell. Additionally, each cell is selectively operable in a storage node write mode and a storage node read mode. During the storage node write mode in a specific cell, the first data value can be written to the capacitor (i.e., the storage node) of the DRAM structure in the specific cell, thereby allowing the first data value to be repeatedly refreshed and/or changed. During the storage node read mode of the specific cell, the first data value can be read out from the capacitor (i.e., the storage node) of the DRAM structure.

Another embodiment of the IC structure can include an array of integrated pixel and read only memory (ROM) cells configured for deep in-sensor, in-memory computing (e.g., of neural networks (NNs)). The cells can be arranged in columns and rows. Each cell can include a select transistor. Each cell can further include a ROM structure with a storage node, which is operably connected to the select transistor and which stores a first data value. Specifically, the storage node can be permanently connected to a specific one of multiple different voltage rails arbitrarily corresponding to different binary values. Each cell can further include a pixel. The pixel can include a sense node, which is operably connected to the select transistor, and a photodiode, which is electrically connected to the sense node.

The IC structure can further include word lines for the rows of cells, respectively, and bit lines for the columns of cells, respectively. Each word line can be electrically connected to the gates of the select transistors of all of the cells in a corresponding row. Each bit line can be electrically connected to the source regions of the select transistors of all of the cells in a corresponding column.

Each cell can be selectively operable in a functional computing mode. During the functional computing mode in a specific cell in a specific row and a specific column, the photodiode can perform a light sensing process that results in a second data value being output on the sense node. Additionally, a specific word line for the specific row can be activated causing the select transistor for the specific cell to switch to an ON state and automatically adjust a bit line voltage on a specific bit line for the specific column as a function of both the first data value stored in the specific cell and the second data value sensed by the specific cell. Given the permanent connection of the storage node to only one of the multiple different voltage rails, each cell is selectively operable in a storage node read mode but not a storage node write mode. During the storage node read mode of the specific cell, the first data value can be read out from the storage node of the ROM structure in the specific cell.

It should be noted that, in each of the above-described IC embodiments, during the functional computing mode, any change in the bit line voltage on a specific bit line for a specific column in response to a select transistor of a specific cell in that column switching to the ON state during the functional computing mode will be indicative of the product of the first data value stored in the specific cell and the second data value sensed by the specific cell. Furthermore, for cognitive computing operations, multiple cells in the same specific column can be concurrently selectively operated in the functional computing mode. In this case, the total change in the bit line voltage (or current) on the specific bit line for the specific column in response to multiple select transistors of multiple cell in the specific column concurrently switching to the ON state following light sensing processes will be indicative of the result of a dot product computation (i.e., will be indicative of the sum of the products of the first data value and the second data value from each specific cell in the specific column).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, image and voice processing applications typically employ cognitive computing and, particularly, neural networks (NNs) for recognition and classification. Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a convolution filter matrix (also referred to as a kernel) of the same size as the receptive field, and to further compute the sum of the products. Historically, software solutions were employed to compute NNs. However, processors with hardware-implemented NN's have been developed to increase processing speed. One disadvantage of processors with hardware-implemented NNs is that they are discrete processing units. For example, a processor with a hardware-implemented NN is typically physically separated from the pixel array that captures the input data (i.e., the processor and the pixel array are in different consumer electronic devices or different chips within the same device). As a result, the data from the pixel array must be uploaded to the processor prior to performing any cognitive computing.

In view of the foregoing, disclosed herein are embodiments of an integrated circuit structure and, particularly, a processing chip, which includes an array of integrated pixel and memory cells configured for deep in-sensor, in-memory computing (e.g., of neural networks (NNs)). Each of the cells in the array can incorporate both a memory structure (e.g., a dynamic random access memory (DRAM) structure, a read only memory (ROM) structure or some other suitable memory structure) with a storage node, which stores a first data value (e.g., a binary weight value), and a pixel with a photodiode, which is connected to a sense node and which outputs a second data value (e.g., an analog input value) on the sense node. Each of the cells is selectively operable in a functional computing mode during which the voltage level on a bit line is adjusted as a function of both the first data value and the second data value. Each of the cells is also selectively operable in a storage node read mode. Furthermore, depending upon the type of memory structure (e.g., a DRAM structure), each of the cells may be selectively operable in a storage node write mode.

Figure 1:
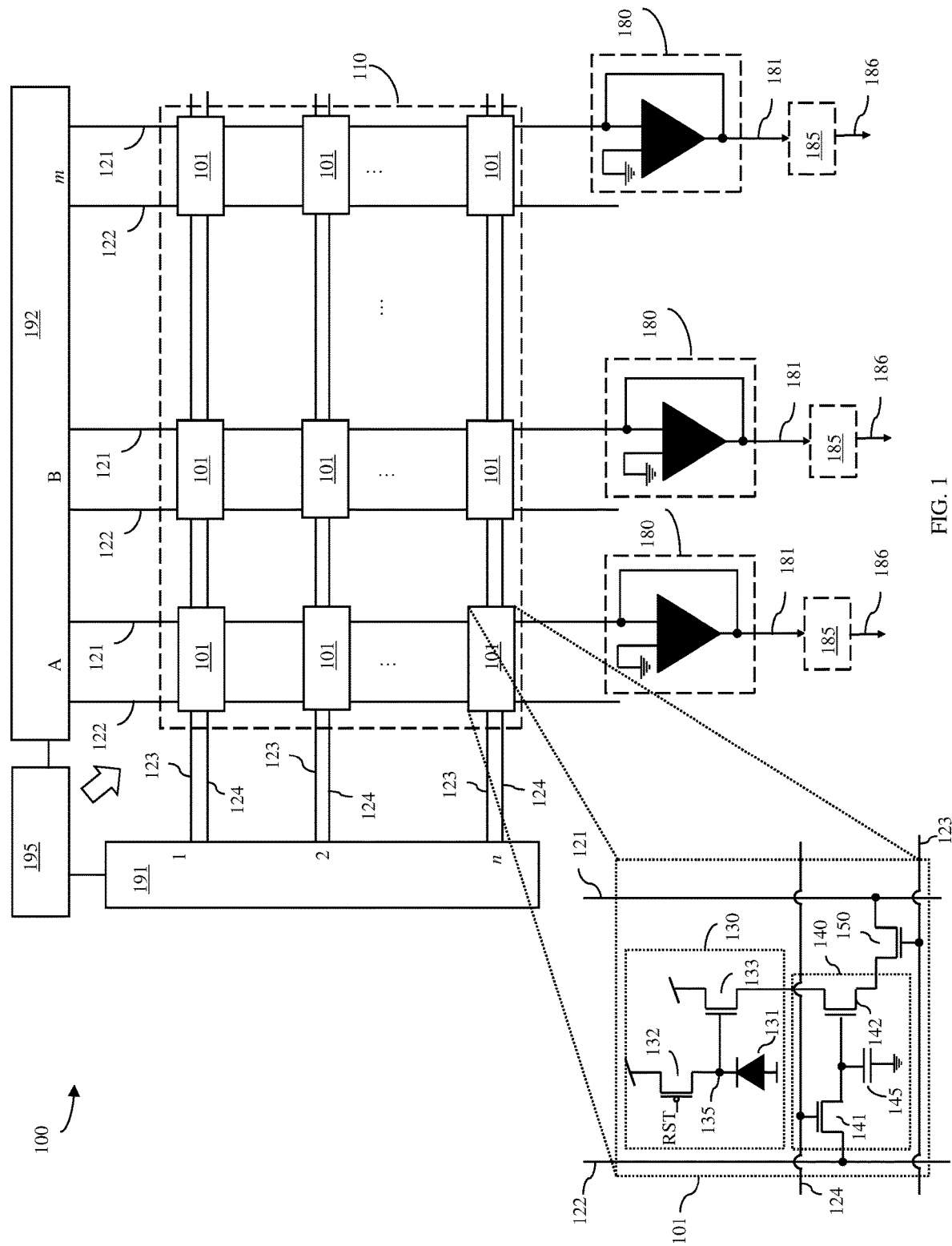
FIG. 1 is a schematic diagram illustrating an embodiment of an integrated circuit (IC) structure that includes an array of integrated pixel and DRAM cells configured for deep in-sensor, in-memory computing.
Figure 2:
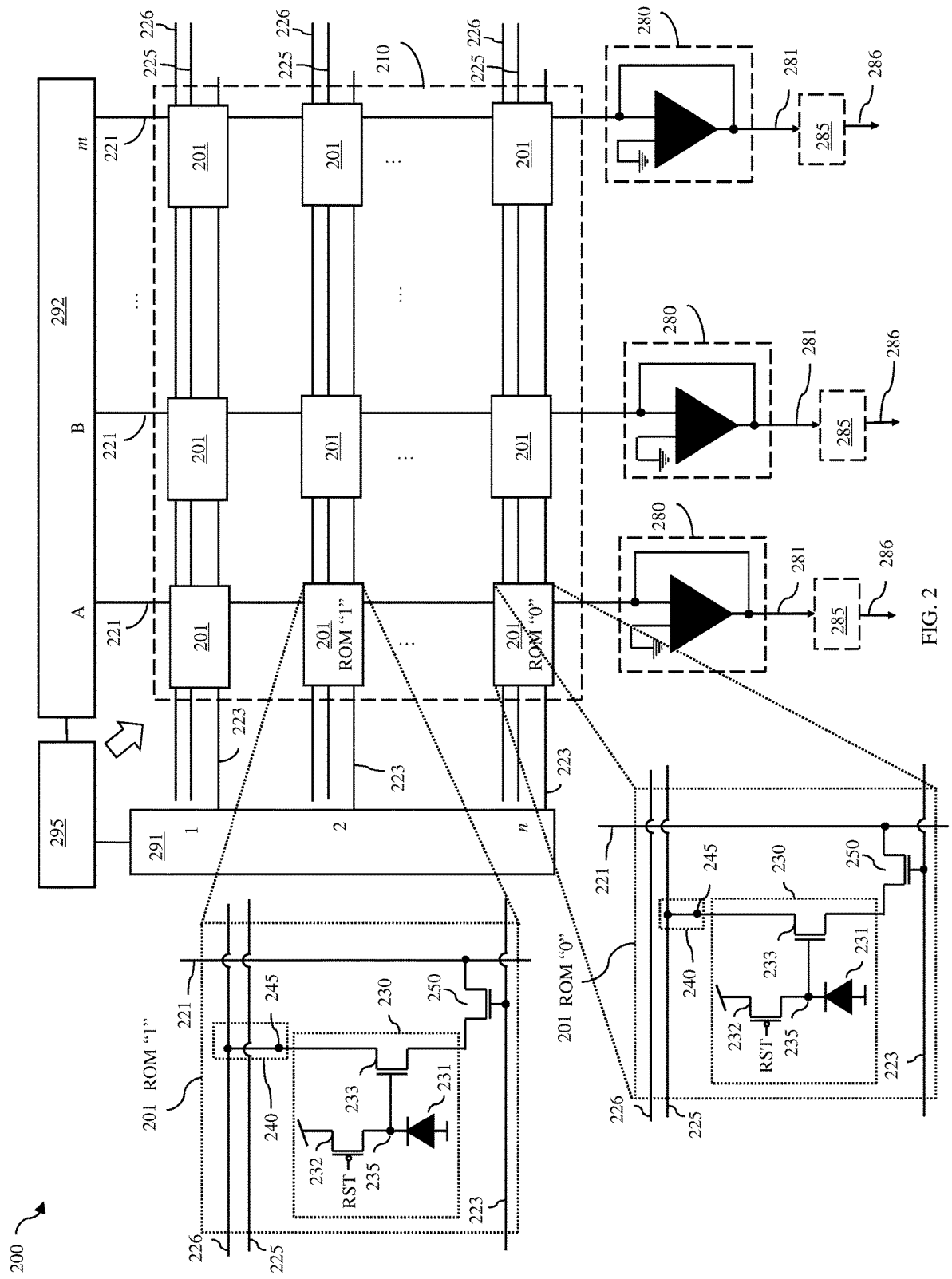
FIG. 2 is a schematic diagram illustrating an embodiment of an IC structure that includes an array of integrated pixel and ROM cells configured for deep in-sensor, in-memory computing.

FIGS. 1 and 2 are schematic diagrams illustrating embodiments an integrated circuit (IC) structure (i.e., a processing chip) 100, 200, respectively.

The IC structure 100, 200 can include an array 110, 210 of integrated pixel and memory cells 101, 201, which are configured for deep in-sensor, in-memory computing (e.g., of neural networks (NNs)). The cells 101, 201 within the array 110, 210 can be arranged in columns (e.g., see columns A, B, . . . m) and rows (e.g., see rows 1, 2, . . . n).

Word line(s) can be electrically connected to the cells 101, 201 in each row. Bit line(s) can be electrically connected to the cells 101, 201 in each column. For example, the IC structure 100 of FIG. 1 includes first and second word lines 123 and 124 connected to the cells 101 in each row 1-n and first and second bit lines 121 and 122 connected to the cells 101 in each column A-m, as discussed in greater detail below. The IC structure 200 of FIG. 2 includes a single word line 223 for each row 1-n and a single bit line 221 for each column, as discussed in greater detail below. Thus, within the array 110, 210, each cell 101, 201 will be located at a unique row and column address and will be connected to a least one word line for the row and at least one bit line for the column.

Each cell 101, 201 can include: a select transistor 150, 250; a pixel 130, 230; and a memory structure 140, 240.

The select transistor 150, 250 can be an n-type field effect transistor (NFET). In any specific cell 101 within any specific row and any specific column of the array 110 of the IC structure 100 of FIG. 1, the select transistor 150 can have a gate electrically connected to the first word line 123 for the specific row and a source region electrically connected to the first bit line 121 for the specific column. In any specific cell 201 within any specific row and any specific column of the array 210 of the IC structure 200 of FIG. 2, the select transistor 250 can have a gate electrically connected to the single word line 223 for the specific row and a source region electrically connected to the single bit line 221 for the specific column.

The pixel 130, 230 can include a photodiode 131, 231. The photodiode 131, 231 can be, for example, a PIN photodiode. The pixel 130, 230 can also include a reset transistor 132, 232 (e.g., a p-type field effect transistor (PFET)) and an amplifying transistor 133, 233 (e.g., another NFET, also referred to in the art as a source-follower transistor). The reset transistor 132, 232 and the photodiode 131, 231 can be electrically connected in series between a positive voltage rail and a ground rail. The reset transistor 132, 232 can have a gate controlled by a reset (RST) signal (e.g., from a controller 195, 295). The pixel 130, 230 can further include a sense node 135, 235 at the junction between the photodiode 131, 231 and the reset transistor 132, 232. The amplifying transistor 133, 233 can have a gate electrically connected to the sense node 135, 235.

The memory structure 140, 240 can include a storage node 145, 245, which is operably connected to the select transistor 150, 250 and which stores a first data value (e.g., a binary weight value).

For example, referring specifically to the IC structure 100 of FIG. 1, the memory structure 140 in each cell 101 can be a dynamic random access memory (DRAM) structure. This DRAM structure can include: an access transistor 141; a storage node 145 in the form of a capacitor connected in series between the access transistor 141 and ground; and a second amplifying transistor 142 (e.g., yet another NFET, also referred to as a source-follower transistor). In any specific cell 101 within any specific row and any specific column of the array 110, the access transistor 141 of the DRAM structure 140 can have a source region electrically connected to the second bit line 122 for the specific column, a drain region electrically connected to the capacitor 145, and a gate electrically to the second word line 124 for the specific row. Furthermore, the gate of the second amplifying transistor 142 can be electrically connected to the same conductive plate of the capacitor 145. That is, there is a junction between the drain region of the access transistor 141, one conductive plate of the capacitor 145 and the gate of the second amplifying transistor 142. Finally, the amplifying transistor 133 of the pixel 130, the second amplifying transistor 142 of the DRAM structure 140, and the select transistor 150 can all be electrically connected in series between the positive voltage rail and the first bit line 121 for the specific column. As mentioned above, the gate of the select transistor 150 can be electrically connected to the first word line 123 for the specific row. With a DRAM structure 140 that is integrated with a pixel 130 in this manner, each integrated pixel and DRAM cell 101 in the array 110 of the IC structure 100 of FIG. 1 is selectively operable in the following modes: (a) a storage node write mode; (b) a storage node read mode; and (c) a functional computing mode.

Alternatively, referring specifically to the IC structure 200 of FIG. 2, the memory structure 240 in each cell 201 can be a read only memory (ROM) structure. In the ROM structure 240, the storage node 245 can be electrically connected to one of multiple different voltage rails that are connected to different voltage levels to arbitrarily represent different data values. In the exemplary embodiment shown in FIG. 2, this ROM structure can be a single bit ROM structure. That is, for any given cell 201, the storage node 245 can be electrically connected to one of two different voltage rails including a first voltage rail 225, which is charged to a first voltage level to arbitrarily and consistently represent a single-bit first data value of "0", or a second voltage rail 226, which is connected to a second voltage level that is different from the first voltage level to arbitrarily and consistently represent a single-bit first data value of "1". This electrical connection can be made during manufacturing such that the first data value will remain either a "0" or a "1". Furthermore, in any specific cell 201 within any specific row and any specific column of the array 210, the amplifying transistor 233 and select transistor 250 can be electrically connected in series between the storage node 245 of the ROM structure 240 and the single bit line 221 for the specific column. As mentioned above, the gate of the select transistor 250 can be electrically connected to the word line 223 for the specific row. With a ROM structure 240 that is integrated with a pixel 230 in this manner, each integrated pixel and ROM cell 201 in the array 210 of the IC structure 200 of FIG. 2 is selectively operable in the following modes: (a) a storage node read mode; and (b) a functional computing mode. It should be noted that the cells 201 are not operable in a storage node write mode due to the nature of the ROM structure. As discussed in greater detail below, each cell 201 may also be selectively operable in a sense node read mode.

More specifically, the IC structure 100, 200 can further include a sense circuit configured to sense changes in the voltage levels (or current flowing) on (through) bit lines (i.e., the first bit lines 121 of the columns in the IC structure 100 and the single bit line 221 of the columns in the IC structure 200). The sense circuit can include, for example, transimpedance amplifiers (TIAs) 180, 280 for each of the columns, respectively. The TIAs 180, 280 can detect and output (i.e., can be adapted to detect and output, can be configured to detect and output, etc.) the analog voltage levels on the bit lines 121, 221 for each column, respectively. Specifically, each TIA 180, 280 can have a first input, which is electrically connected to ground, and a second input, which is electrically connected to a bit line 121 221 for a column in order to receive a current (Iin) from that bit line 121, 221. Each TIA 180, 280 can further convert (i.e., can be adapted to convert, can be configured an output, etc.) the received current (Iin) into an analog output voltage (Vout). The analog output voltage 181, 281 of the TIA 180, 280 (i.e., Vout) can further be electrically connected via a feedback resistor to the bit line 121, 221 for the column (i.e., to the second input). In any case, various different TIA configurations are well known in the art. Thus, the details of the TIAs have been omitted from this specification in order to allow the reader to focus on the salient aspects of the disclosed embodiments.

Optionally, the IC structure 100, 200 can further include analog-to-digital converters (ADCs) 185, 285 for each of the columns, respectively. The ADCs 185, 285 can, for example, receive the analog output voltages 181, 281 from the TIA's 180, 280, respectively, and can convert (i.e., can be adapted to convert, can be configured to convert, etc.) those analog output voltages 181, 281 to digital outputs 186, 286, respectively. ADCs capable of converting analog output voltages to digital values are well known in the art. Thus, the details of the ADCs have been omitted from this specification in order to allow the reader to focus on the salient aspects of the disclosed embodiments.

The IC structure 100, 200 can further include a controller 195, 295 and peripheral circuitry 191-192, 291-292. In response to control signals from the controller 195, 295, the peripheral circuitry 191-192, 291-292 can enable the cells 101, 201 to be individually selectively operated in the storage node read mode. In the case of the IC structure 100, in response to control signals from the controller 195, the peripheral circuitry 191-192 can also enable the cells 101, 201 to be individually selectively operated in the storage node write mode. Additionally, in response to control signals from the controller 195, 295, the peripheral circuitry 191-192, 291-292 can further enable the cells 101, 201 to be selectively operated in a functional computing mode either individually or concurrently, as discussed below. Peripheral circuitry 191, 291 connected to the rows (at one end or at a combination of both ends) can include, for example, address decode logic and word line drivers for activating selected word lines (i.e., for switching selected word lines from low to high voltage levels) during the read, write (if applicable), and functional computing operations. Peripheral circuitry 192, 292 connected to the columns (at one end or at a combination of both ends) can include column address decode logic and bit line drivers for appropriately biasing selected bit lines during the read, write (if applicable) and functional computing operations. Additional peripheral circuitry (not shown) can also supply the reset signals to gates of the reset transistors of the pixels in the cells. Controllers and peripheral circuitry used to enable pixel array and memory array operations are well known in the art. Thus, the details thereof have been omitted from this specification in order to allow the reader to focus on the salient aspects of the disclosed embodiments.

As mentioned above, each integrated pixel and DRAM cell 101 in the array 110 of the IC structure 100 of FIG. 1 is selectively operable in the following modes: (a) a storage node write mode, wherein the first data value is written to the storage node 145; (b) a storage node read mode, wherein the first data value is read from the storage node 145; and (c) a functional computing mode.

Figures 3A, 3B:
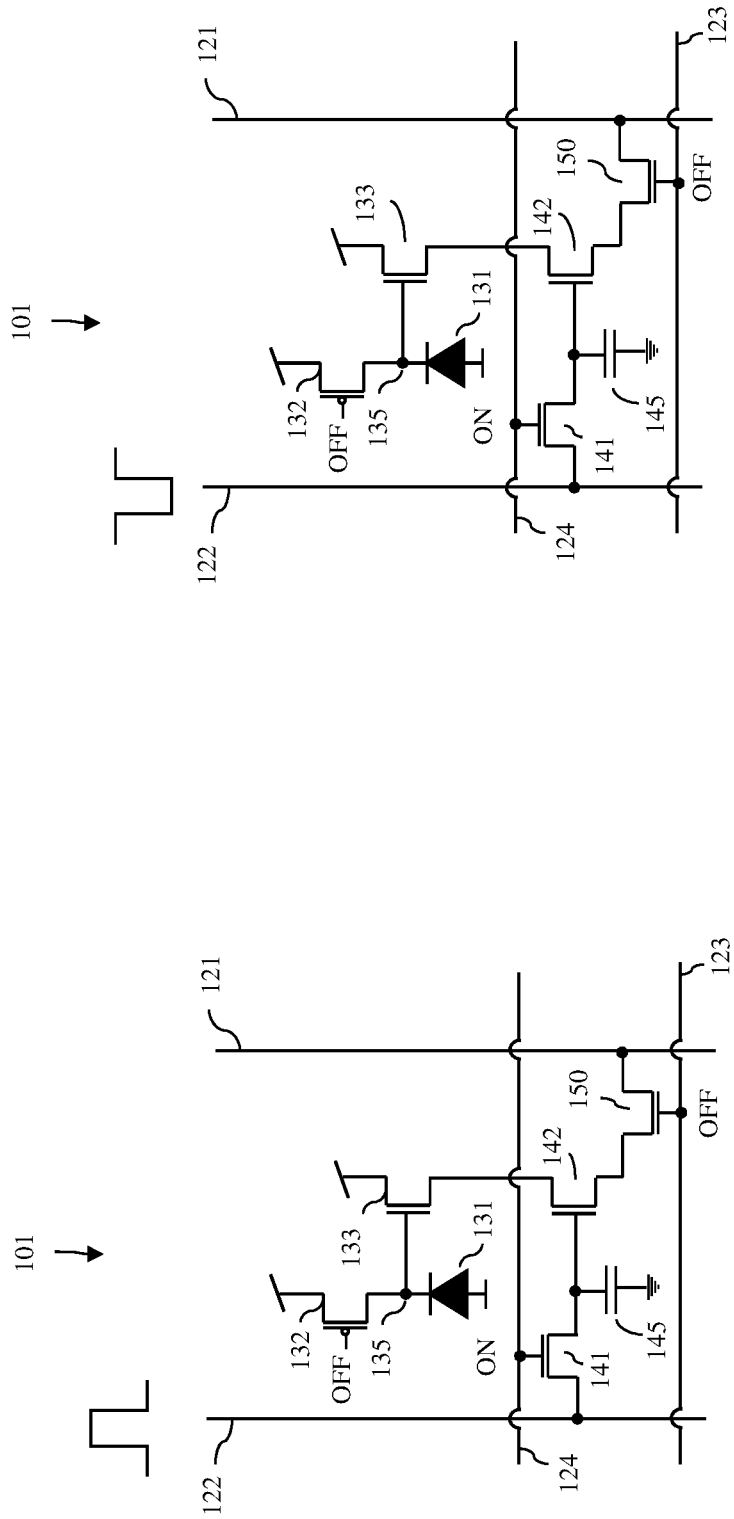
FIGS. 3A and 3B are schematic diagrams illustrating an exemplary integrated pixel and DRAM cell during a storage node write "1" operation and a storage node write "0" operation, respectively.

During the storage node write mode, a first data value can be written to the storage node 145. This first data value can be a single-bit binary data value (e.g., "1" or "0"). For example, this first data value can be a binary weight value that will be employed for a cognitive computing operation (e.g., during computation of a cognitive neural network (NN)). As illustrated in FIG. 3A, a first data value of "1" can be written to the storage node 145 (i.e., the capacitor) by pre-charging the specific second bit line 122 connected to the source region of the access transistor 141 to a high voltage level (e.g., VDD) and then activating the specific second word line 124 connected to the gate of that access transistor 141 (i.e., then switching the specific second word line 124 from a low voltage level (e.g., 0.0V) to a high voltage level (e.g., VDD)), thereby switching the access transistor 141 from an OFF state (i.e., a non-conductive state) to an ON state (i.e., to a conductive state) and pulling up the voltage level on the storage node 145. As illustrated in FIG. 3B, a first data value of "0" can be written to the storage node 145 (i.e., the capacitor) by discharging the specific second bit line 122 connected to the source region of the access transistor 141 to ground and then activating the specific second word line 124 connected to the gate of that access transistor 141 (i.e., then switching the specific second word line 124 from a low voltage level (e.g., 0.0V) to a high voltage level (e.g., VDD)), thereby switching the access transistor 141 from an OFF state to an ON state and pulling down the voltage level on the storage node 145.

Figure 4:
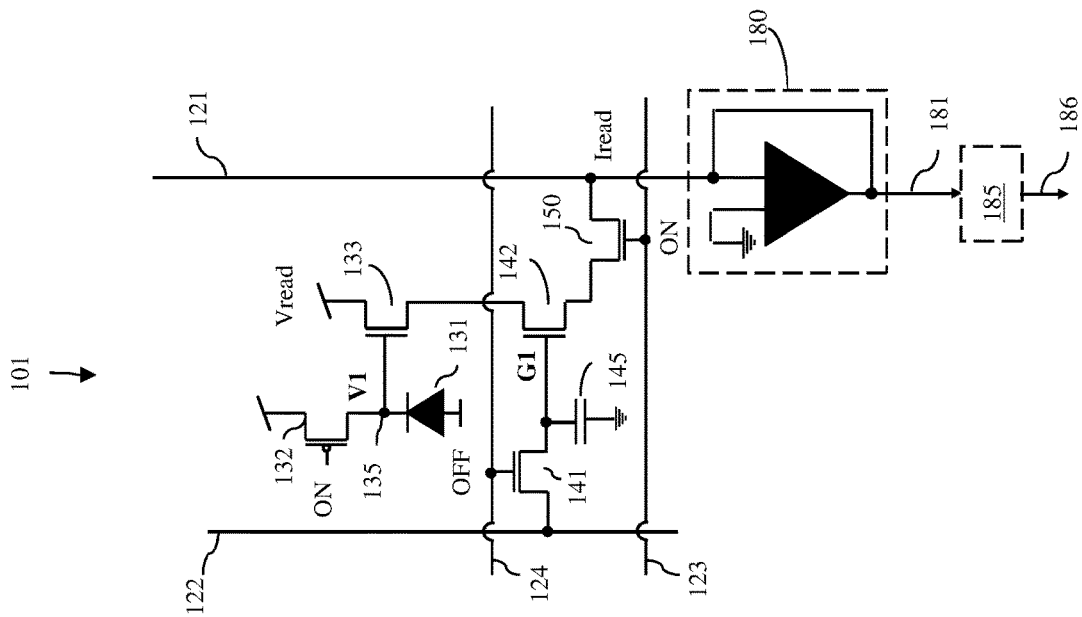
FIG. 4 is a schematic diagram illustrating an exemplary integrated pixel and DRAM cell during a storage node read operation.

During the storage node read mode, the first data value can be read from the storage node 145. As mentioned above, this first data value can be a single-bit binary data value of either "1" or "0". As illustrated in FIG. 4, in order to read the first data value from the storage node 145, the reset (RST) signal can be switch from a high voltage level (e.g., VDD) to a low voltage level (e.g., 0.0V) so as to switch the reset transistor 132 from an OFF state to an ON state, thereby pulling up the voltage level on the sense node 135 and, in turn, switching the amplifying transistor 133 to the ON state. Additionally, the specific first word line 123 connected to the gate of the select transistor 150 can be activated (i.e., the specific first word line 123 can be switched from a low voltage level (e.g., 0.0V) to a high voltage level (e.g., VDD)), thereby switching the select transistor 150 from the OFF state to the ON state. If only the specific first word line 123 for that specific row is activated (i.e., no other first word lines are activated), then the read current (Tread) sensed on the specific first bit line 121 for the column (e.g., by the sense circuit including the TIA 180) will indicate whether the first data value is a "1" or a "0". Specifically, since the amplifying transistor 133 is in the ON state, then current will flow to the specific first bit line 121 only if the first data value is a "1". That is, Tread will be 0 (i.e., there will be no detected current flow) if the first data value is a "0" and Tread will be a finite current amount if the first data value is a "1".

Figure 5:
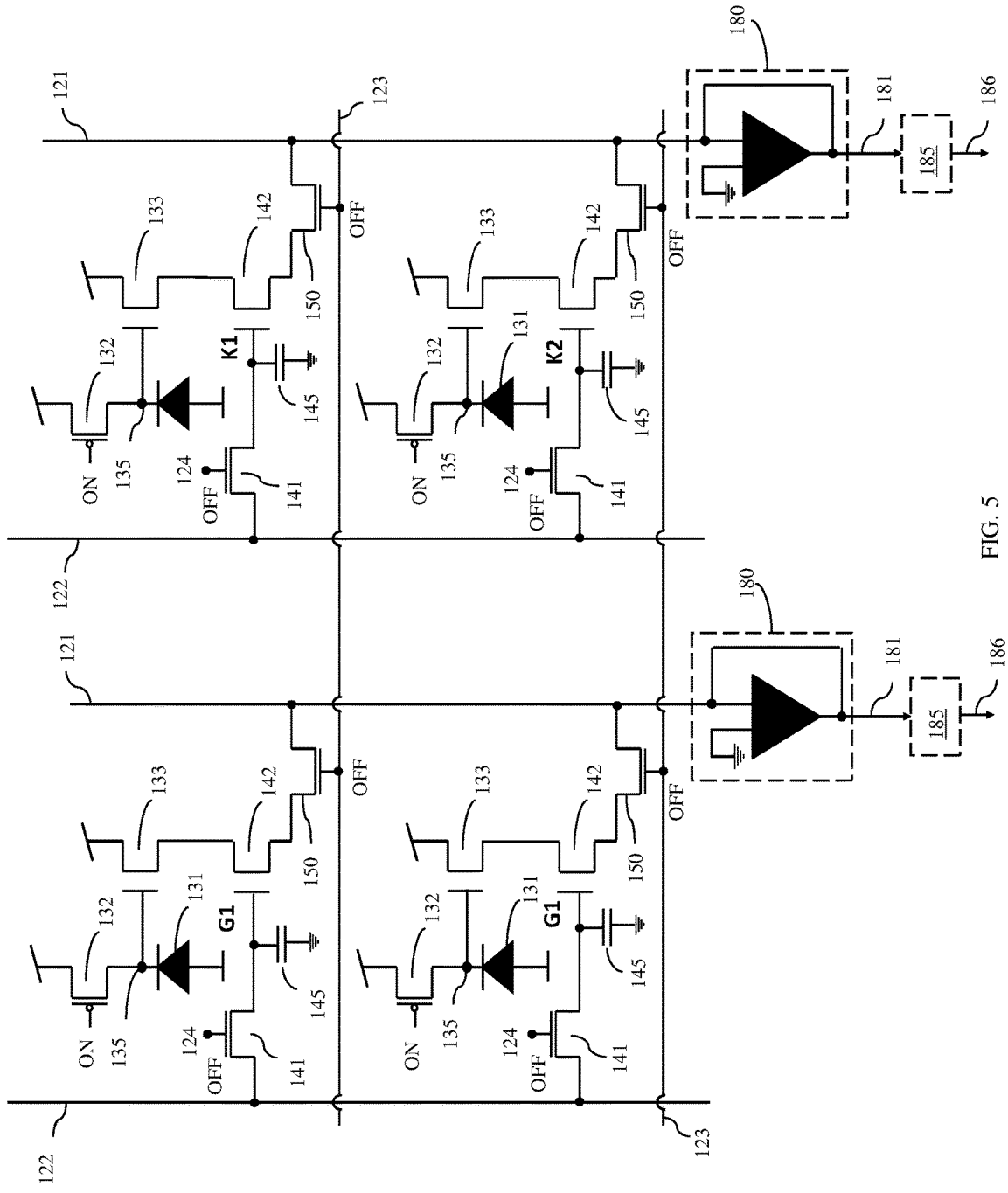
FIG. 5 is a schematic diagram illustrating an exemplary array of integrated pixel and DRAM cells during an operation to pre-charge sense nodes prior to a functional compute operation.
Figure 6:
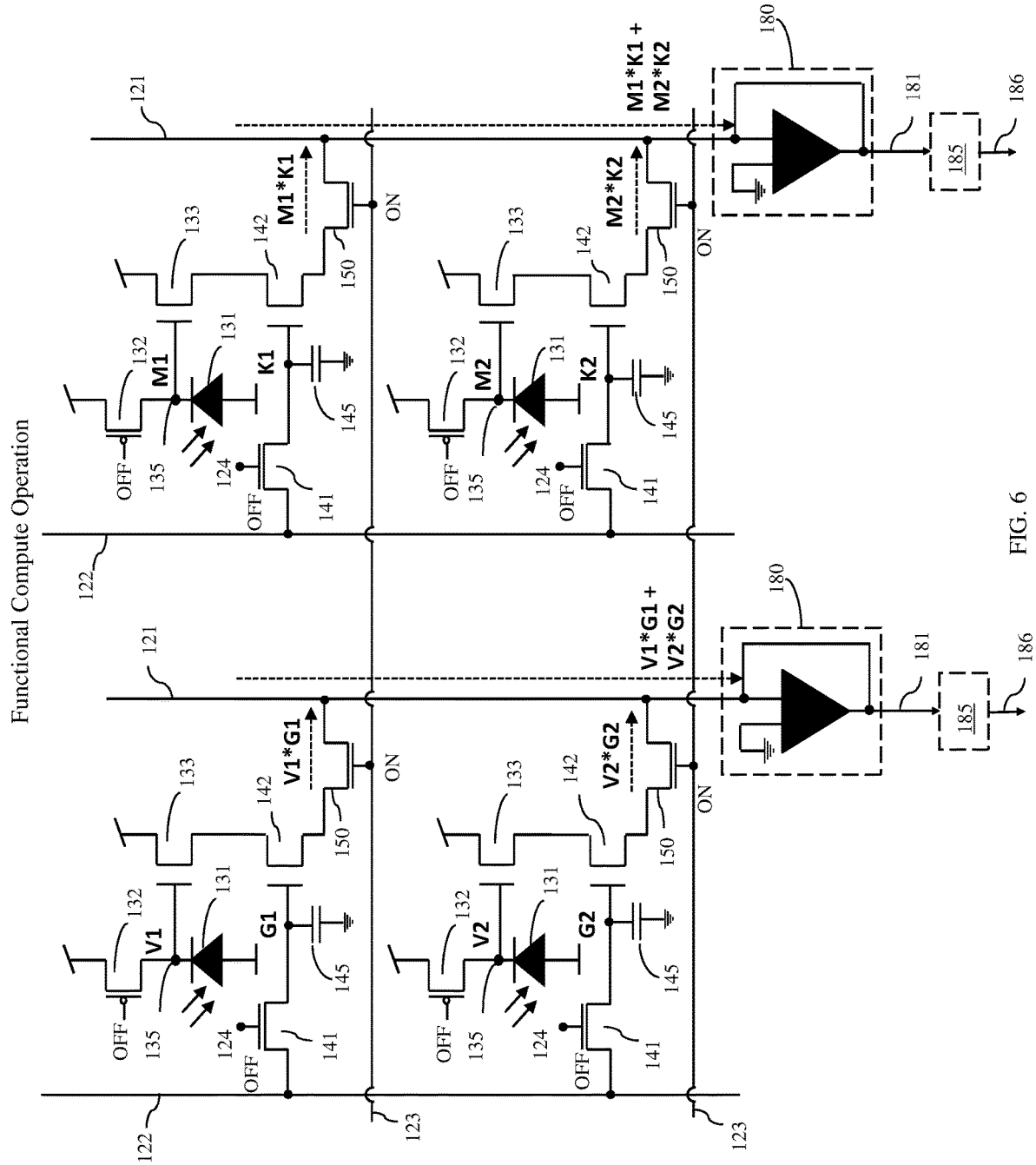
FIG. 6 is a schematic diagram illustrating an exemplary array of integrated pixel and DRAM cells during a functional compute operation.

Prior to the functional computing mode, the sense node 135 must be pre-charged to a high voltage level (e.g., VDD). To accomplish this, the reset signal (RST) applied to the gate of the reset transistor can be switch from a high voltage level to a low voltage level so as to switch the reset transistor 132 to the ON state, thereby pulling up the voltage level on the sense node 135 (see FIG. 5). It should be noted that FIG. 5 shows four cells, two per column and two per row. The first data values stored on the storage nodes 145 of the cells 101 in the first column are G1 and G2, respectively. The first data values stored on the storage nodes 145 in the cells 101 in the second column are K1 and K2, respectively. Once the sense node 135 is pre-charged, the reset signal (RST) can be switched back to the high voltage level so as to turn off the reset transistor 132. Next, the photodiode 131 can be exposed to light in order to perform a light sensing process, which results in a second data value being output on the sense node 135 (see FIG. 6). Specifically, an analog light intensity value sensed by the photodiode 131 is represented by a voltage signal (also referred to herein as an activation value) that is output on the sense node 135 and, thereby applied to the gate of the amplifying transistor 133. It should be noted that FIG. 6 shows the same four cells as shown in FIG. 5. In this case, the second data values sensed by the photodiodes 131 and output on the sense nodes 135 of the cells 101 in the first column are V1 and V2, respectively. Such sensed data values can be the data inputs (also referred to herein as activation values) for a cognitive computing operation (e.g., for computation of a cognitive neural network (NN)). The second data values sensed by the photodiodes 131 and output on the sense nodes 135 in the cells 101 in the second column are M1 and M2, respectively. Following the light sensing process, the specific first word line 123 for a specific row can be activated (i.e., can be switched from a low voltage level to a high voltage state), thereby causing the select transistor 150 of the specific cell 101 to switch from an OFF state to an ON state. The select transistor 150 in the ON state can then automatically adjust the bit line voltage on the specific first bit line 121 for the specific column as a function of both the first data value, which is stored on the storage node 145 of the specific cell 101 and the second data value, which was output on the sense node 135 of the specific cell 101. Any change in the bit line voltage on the specific first bit line 121 for the specific column in response to the select transistor 150 of that specific cell 101 switching to the ON state will be indicative of the product of the first data value and the second data value.

It should be noted that, for cognitive computing operations, when multiple cells in the same specific column are concurrently selectively operated in the functional computing mode and, optionally, when parallel processing is performed in multiple columns, the total change in the bit line voltage (or bit line current) on each specific first bit line for each specific column in response to the select transistors of multiple or all cells in the specific column concurrently switching to the ON state following light sensing processes will be indicative of the result of a dot product computation (i.e., will be indicative of the sum of the products of the first data value and the second data value from each selected cell in the specific column). For example, as illustrated in FIG. 6, the total change in the bit line voltage on the first bit line of the first column when the two cells therein are in the functional computing mode will be approximately equal to (V1*G1)+(V2*G2), whereas the total change in the bit line voltage on the first bit line of the second column when the two cells therein are in the functional computing mode will be approximately equal to (V1*G1)+(V2*G2).

It should be understood that the integrated pixel and DRAM cell 101 shown in FIGS. 1 and 3-6 are offered for illustration purposes and are not intended to be limiting. Other pixel and/or DRAM structure configurations could alternatively be used in the integrated pixel and DRAM cells of the array 110 of the IC structure 100 of FIG. 1.

Figures 7A, 7B:
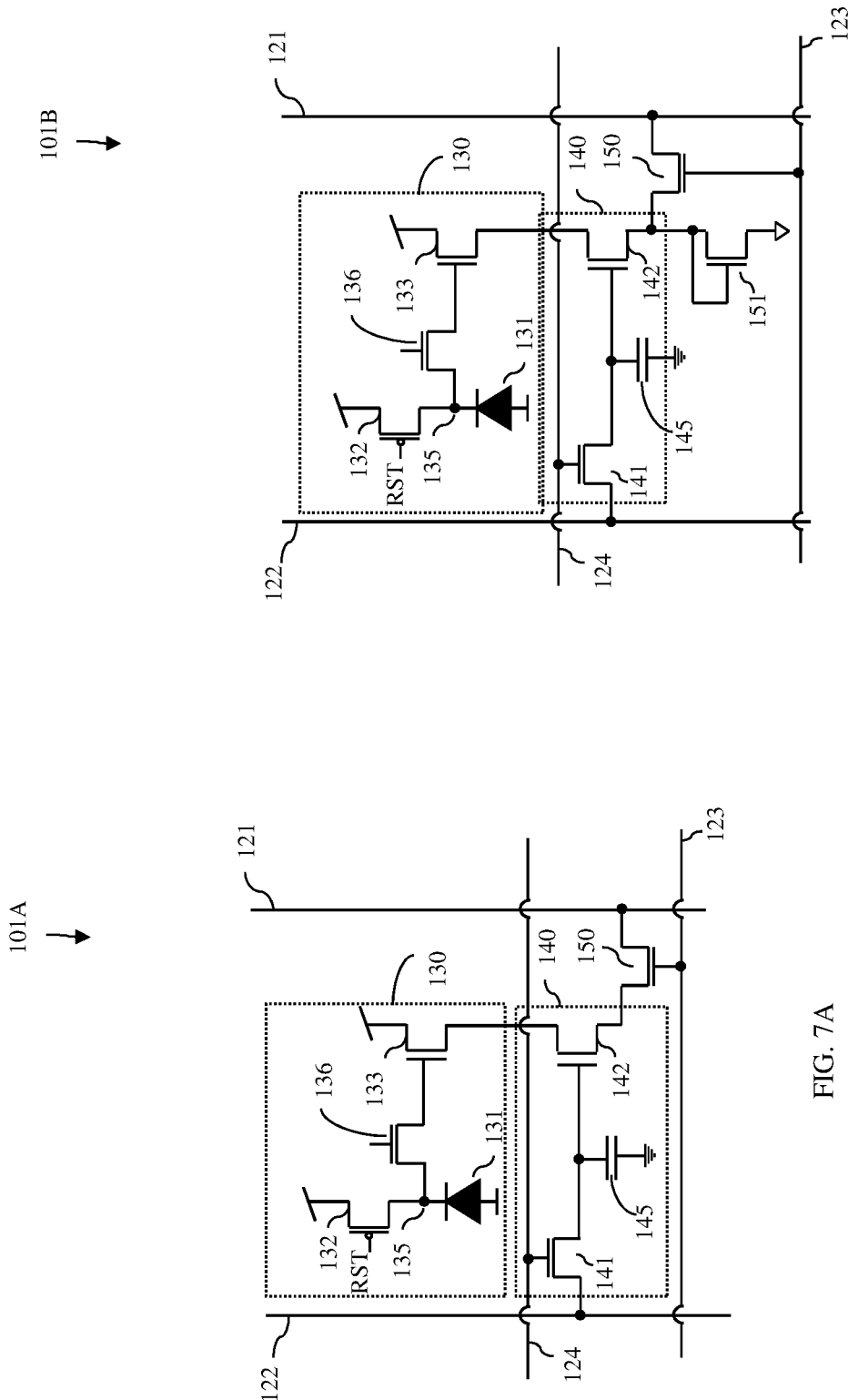
FIGS. 7A and 7B are schematic diagrams illustrating alternative embodiments, respectively, of the integrated pixel and DRAM cell that could be incorporated into the IC structure of FIG. 1.

For example, in some embodiments, each integrated pixel and DRAM cell could include one or more additional transistors. See FIG. 7A and the integrated pixel and DRAM cell 101A, which includes a switch 136 (e.g., an additional NFET, also referred to as an isolation FET) between the sense node 135 and the gate of the amplifying transistor 133 to control current flow to the gate of the amplifying transistor the sensing process by the photodiode is complete. See also FIG. 7B and the integrated pixel and DRAM cell 101B that includes the switch 136 (described above) and another additional NFET 151, which has both a drain region and a gate electrically connected to the junction between the second amplifying transistor 142 and the select transistor 150 and which has a source region connected to ground for improved performance.

Figure 7C:
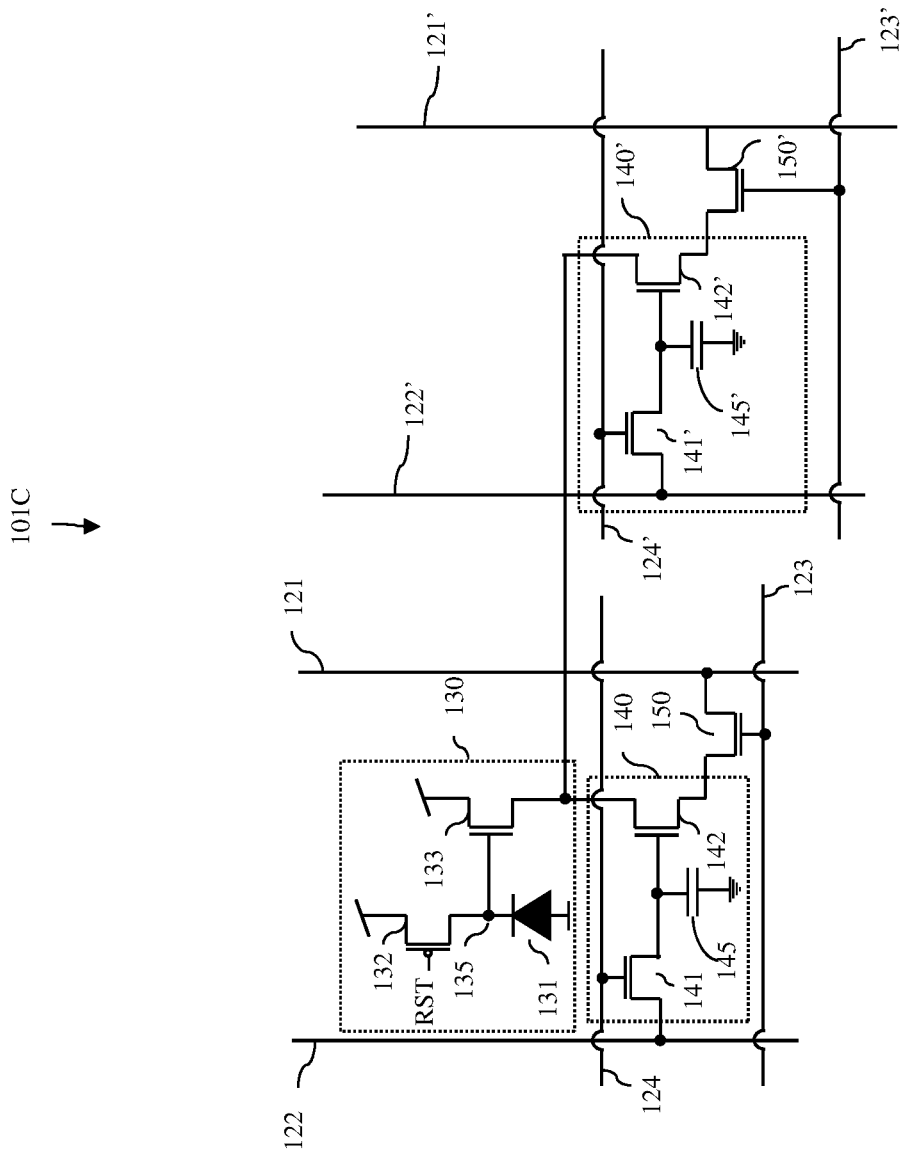
FIG. 7C is a schematic diagram illustrating an embodiment of an integrated pixel and dual-DRAM cell that could, alternatively, be incorporated into the IC structure of FIG. 1.

In some embodiments, the integrated pixel and DRAM cell could also include an additional DRAM structure. See FIG. 7C and the integrated pixel and dual-DRAM cell 101C. This integrated pixel and dual-DRAM cell 101C includes the pixel 130 and a DRAM structure 140 (as described above) and also includes an additional select transistor 150' and an additional DRAM structure 140'. The additional select transistor 150' can have a source region connected to an additional first bit line 121' and a gate connected to an additional first word line 123'. The second DRAM structure 140' can include an additional second amplifying transistor 142' connected in series between the amplifying transistor 133 of the pixel 130 and the additional select transistor 150'. The second DRAM structure 140' can further include an additional access transistor 141' (with a gate connected to an additional second word line 124') and an additional storage node 145' connected in series between an additional second bit line 122' and the gate of the additional second amplifying transistor 142'. The additional storage node 145' can store an additional first data value. Thus, the integrated pixel and dual-DRAM cell 101C can be employed for functional compute operations, where a change in the bit line voltage on the first bit line 121 is a function of both the second data value output from the photodiode 131 onto the sense node 135 and the first data value stored on the storage node 145 of the DRAM structure 140 and where a change in the bit line voltage on the additional first bit line 121' is a function of both the second data value output from the photodiode 131 onto the sense node 135 and the additional first data value stored on the additional storage node 145' of the additional DRAM structure 140'. It should be noted that the integrated pixel and dual-DRAM cell of FIG. 7C is not intended to be limiting. Other integrated pixel and dual-DRAM cells (e.g., with a shared select transistor) could also be incorporated into an array.

As mentioned above, each integrated pixel and ROM cell 201 in the array 210 of the IC structure 200 of FIG. 2 is selectively operable in the following modes: (a) a storage node read mode, wherein the first data value is read from the storage node 145; and (b) a functional computing mode. The cells 201 are not operable in a storage node write mode due to the nature of the ROM structure. However, each cell 201 may also be selectively operable in a sense node read mode.

As mentioned above, the ROM structure in each cell permanently stores first data value. This first data value can be a single-bit data value (i.e., a "1" or a "0"). That is, the ROM can be a single-bit ROM. For example, this first data value can be a binary weight value that will be employed for a cognitive computing operation (e.g., during computation of a cognitive neural network (NN)). In this embodiment, the binary value of the stored data (e.g., a "1" or a "0") depends upon which one of the voltage rails 225-226 the storage node 245 is connected to. Again, the storage node 245 can be permanently connected to a specific one of multiple different voltage rails arbitrarily corresponding to different binary values. For example, when the storage node 245 is electrically connected to the first voltage rail 225 (e.g., VDD), the storage node 245 can be deemed to be storing a first data value of "0". When the storage node 245 is electrically connected to the second voltage rail 226 (e.g., ground), the storage node 245 can be deemed to be storing a first data value of "1".

Figure 8:
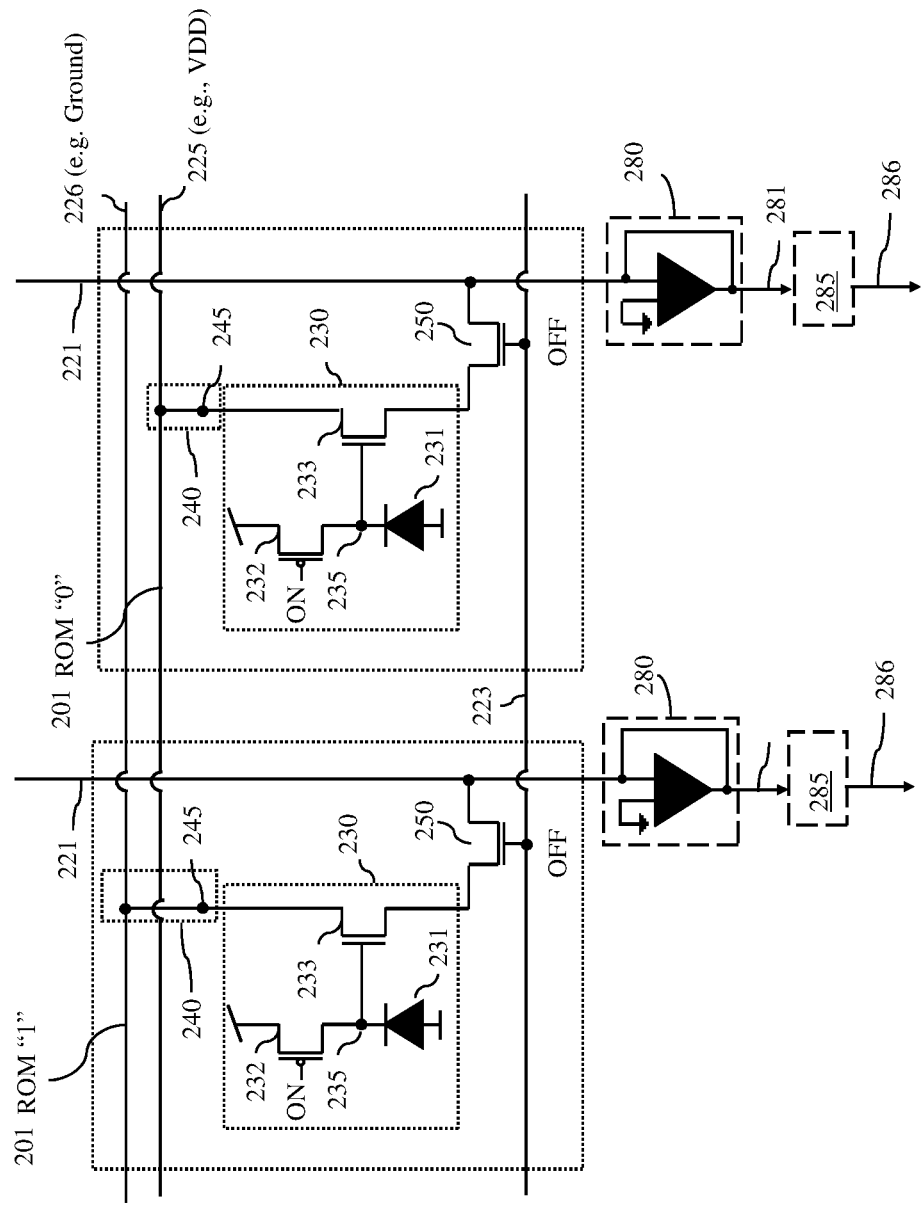
FIG. 8 is a schematic diagram illustrating a portion of an exemplary array of integrated pixel and ROM cells during an operation to pre-charge sense nodes prior to a storage node read operation or a functional compute operation.

Prior to the storage node read mode, the functional computing mode or the optional sense node read mode, the sense node 235 must be pre-charged to a high voltage level (e.g., VDD). To accomplish this, the reset signal (RST) applied to the gate of the reset transistor 232 can be switch from a high voltage level to a low voltage level so as to switch the reset transistor 132 to the ON state, thereby pulling up the voltage level on the sense node 235 (see FIG. 8). Once the sense node 235 is pre-charged, RST switches back to the high voltage level and the reset transistor 132 switches back to the OFF state.

Figure 9:
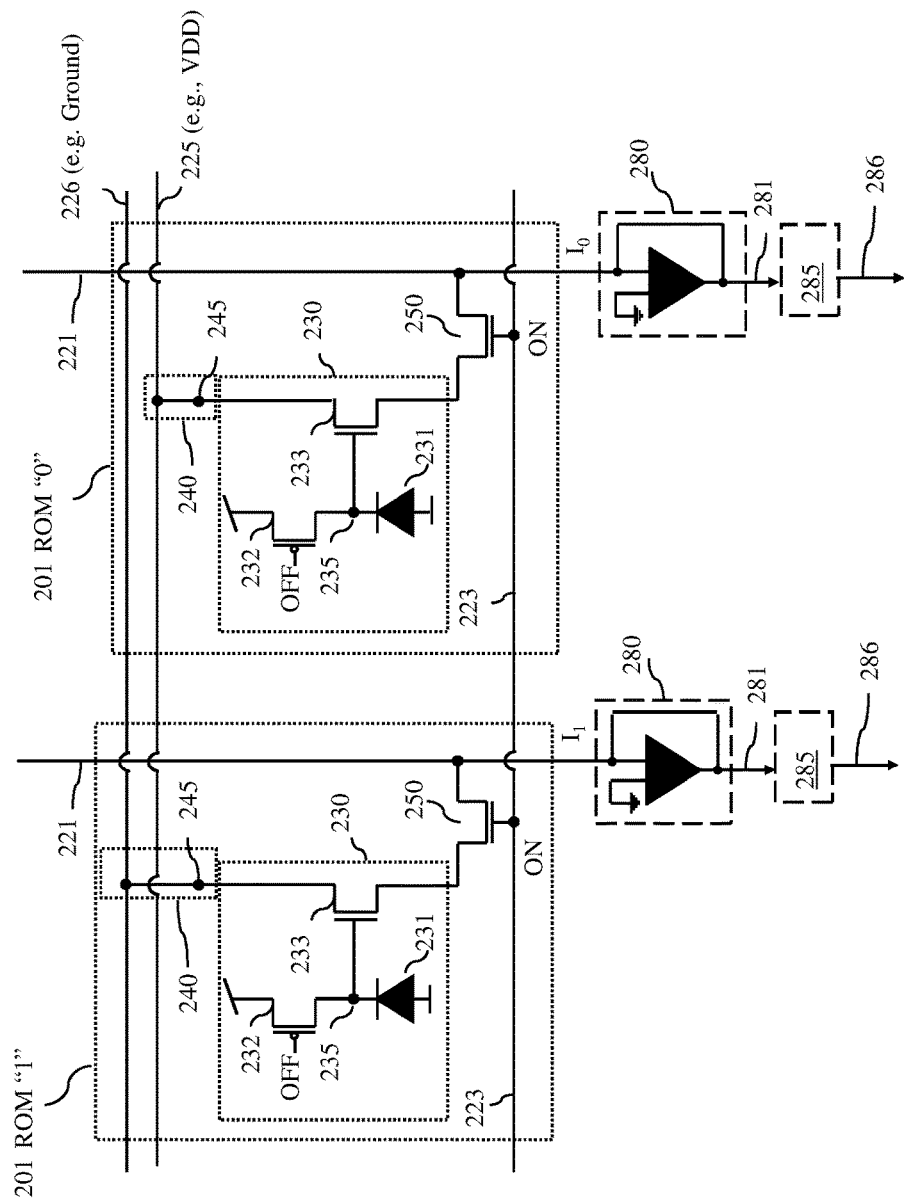
FIG. 9 is a schematic diagram illustrating a portion of an exemplary array of integrated pixel and ROM cells during storage node read operation.

During the storage node read mode, the first data value can be read from the storage node 245. As illustrated in FIG. 9, in order to read the first data value from the storage node 245, the reset transistor 232 remains in the OFF state and the specific word line 223 connected to the gate of the select transistor 250 can be activated (i.e., the specific word line 223 can be switched from a low voltage level (e.g., 0.0V) to a high voltage level (e.g., VDD)), thereby switching the select transistor 250 from the OFF state to the ON state. If only the specific word line 223 for that specific row is activated (i.e., no other word lines are activated), then the read current (Tread) sensed on the specific bit line 221 for the column (e.g., by the sense circuit including the TIA 280) will indicate whether the first data value is a "1" or a "0". Specifically, since the amplifying transistor 233 is in the ON state due to pre-charging of the sense node, then current will flow to the specific bit line 221 only if the storage node 245 is connected to the first voltage rail 225, which is connected to VDD and no current will flow to the specific bit line 221 if the storage node 245 is connected to the second voltage rail 226. That is, Tread will be a finite current amount if the storage node 245 is connected to the first voltage rail 225 (thereby indicating a first data value of "0") and Tread will be 0 (i.e., no current flow will be detected) if the storage node 245 is connected to the second voltage rail 226 (thereby indicating a first data value of "1").

Figure 10:
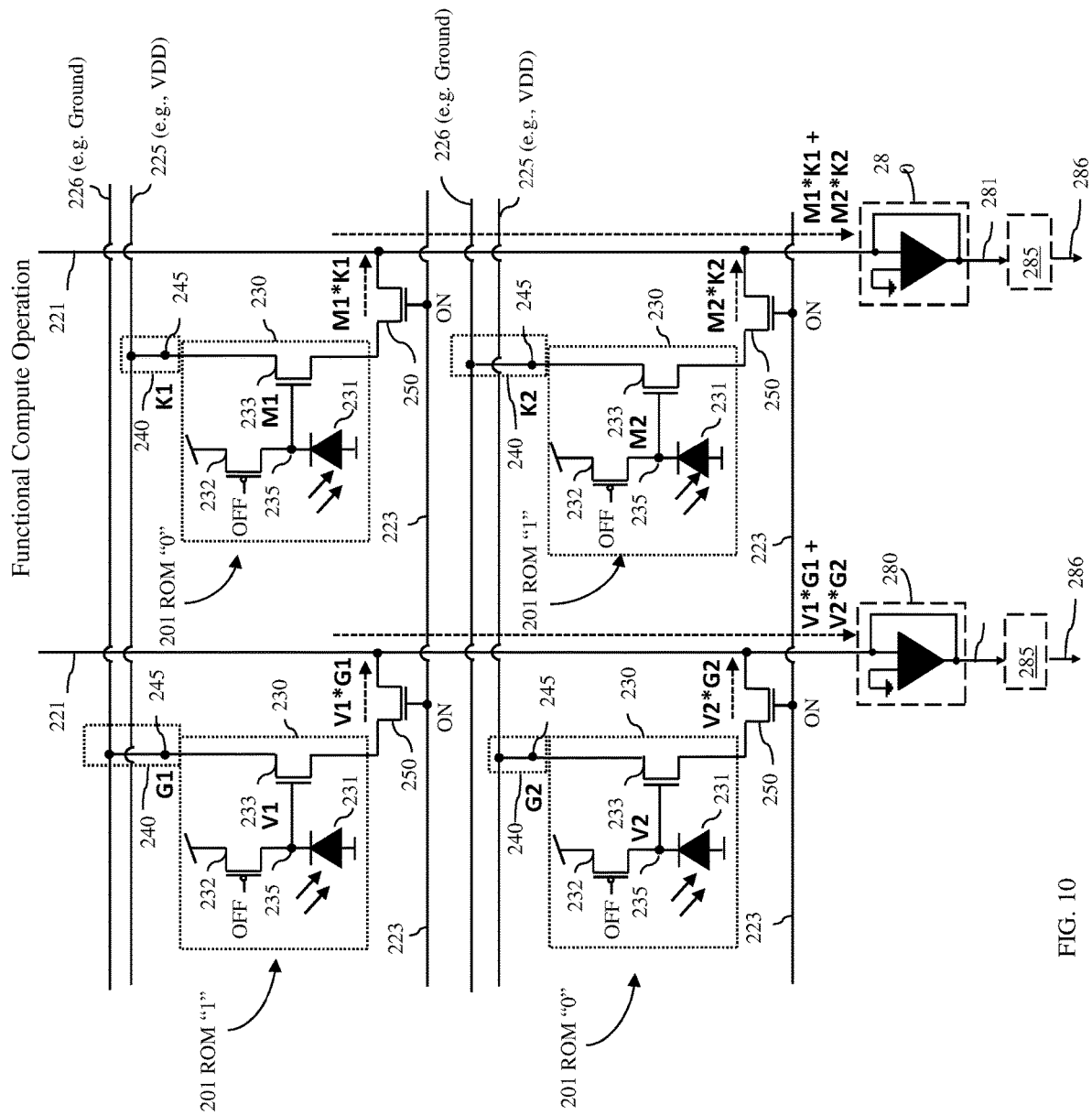
FIG. 10 is a schematic diagram illustrating a portion of an exemplary array of integrated pixel and ROM cells during a functional compute operation.

As mentioned above, prior to the functional computing mode, the sense node 235 must again be pre-charged. The functional computing mode can then be performed as shown in FIG. 10. It should be noted that FIG. 10 shows four cells, two per column and two per row. The first data values stored on the storage nodes 145 of the cells 101 in the first column are G1 and G2, respectively. The first data values stored on the storage nodes 145 in the cells 101 in the second column are K1 and K2, respectively. During the functional computing mode, the photodiode 231 of any given cell can be exposed to light in order to perform a light sensing process, which results in a second data value being output on the sense node 235. Specifically, an analog light intensity value sensed by the photodiode 231 is represented by a voltage signal (also referred to herein as an activation value) that is output on the sense node 235 and, thereby applied to the gate of the amplifying transistor 233. The second data values sensed by the photodiodes 231 and output on the sense nodes 235 of the cells 201 in the first column are V1 and V2, respectively. The second data values sensed by the photodiodes 231 and output on the sense nodes 235 in the cells 201 in the second column are M1 and M2, respectively. Following the light sensing process, the specific word line 223 for a specific row can be activated (i.e., can be switched from a low voltage level to a high voltage state), thereby causing the select transistor 250 of the specific cell 201 to switch from an OFF state to an ON state. The select transistor 250 in the ON state can then automatically adjust the bit line voltage on the specific bit line 221 for the specific column as a function of both the first data value, which is stored on the storage node 245 of the specific cell 201 and the second data value, which was output on the sense node 235 of the specific cell 201. Any change in the bit line voltage on the specific bit line 221 for the specific column in response to the select transistor 250 of that specific cell 201 switching to the ON state will be indicative of the product of the first data value and the second data value.

It should be noted that, for cognitive computing operations, when multiple cells in the same specific column are concurrently selectively operated in the functional computing mode and, optionally, when parallel processing is performed in multiple columns, the total change in the bit line voltage on each specific bit line for each specific column in response to the select transistors of multiple or all cells in the specific column concurrently switching to the ON state following light sensing processes will be indicative of the result of a dot product computation (i.e., will be indicative of the sum of the products of the first data value and the second data value from each selected cell in the specific column). For example, as illustrated in FIG. 10, the total change in the bit line voltage on the bit line of the first column when the two cells therein are in the functional computing mode will be approximately equal to (V1*G1)+ (V2*G2), whereas the total change in the bit line voltage on the bit line of the second column when the two cells therein are in the functional computing mode will be approximately equal to (V1*G1)+(V2*G2).

As mentioned above, optionally, each of the cells 201 may also be selectively operable in a sense node read mode. Specifically, if the voltage level on the second voltage rail 226 can be selectively switched from 0V to VDD, then the sense node 235 of the pixel 230 can be read in a conventional manner. Once the voltage level on the second voltage rail 226 is switched to VDD, the photodiodes 235 in the cells 201 can be exposed to light, can perform light sensing operations and can output second data values onto the sense nodes 235. The word line of a specific row can be activated (i.e., switch from a low voltage level to a high voltage level) so as to turn on the select transistors of the cells 201 in that specific row. If only the specific word line 223 for one specific row is activated (i.e., no other word lines are activated), then the read current (Tread) sensed on the specific bit line 221 for a given column (e.g., by the sense circuit including the TIA 280) will indicate the sensed second data value. Specifically, the amount of current that flows through the amplifying transistor 233 will depend upon the voltage level on the storage node following the light sensing process and any change in the voltage level on the bit line for the given column can be sensed by the sense circuit in order to determine the second data value.

It should be understood that the integrated pixel and ROM cell 201 shown in FIGS. 2 and 8-10 are offered for illustration purposes and are not intended to be limiting. Other pixel and/or ROM structure configurations could alternatively be used in the integrated pixel and ROM cells of the array 210 of the IC structure 200 of FIG. 2.

Figure 11:
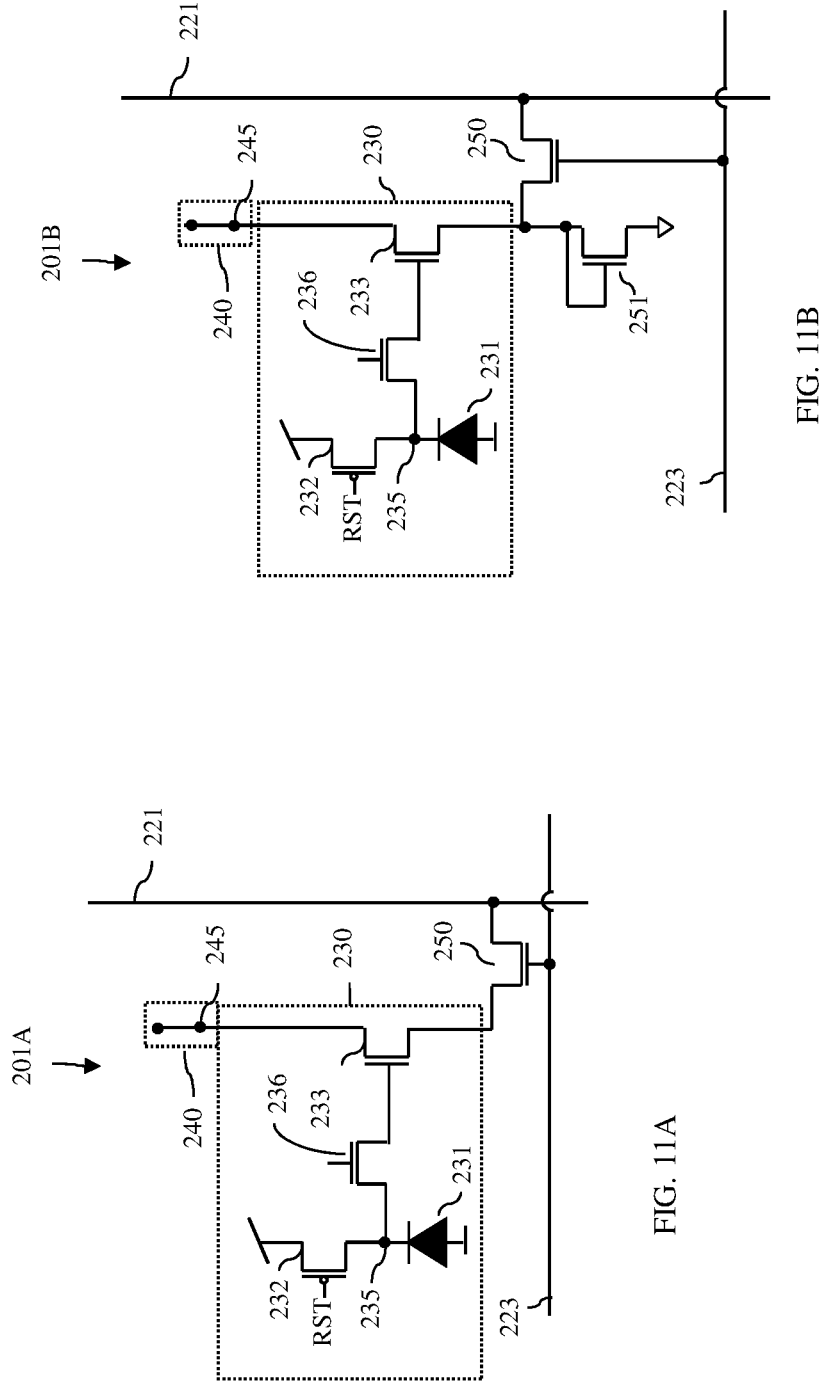
FIGS. 11A and 11B are schematic diagrams illustrating alternative embodiments, respectively, of the integrated pixel and ROM cell that could be incorporated into the IC structure of FIG. 2.

For example, in some embodiments, the integrated pixel and ROM cell could include one or more additional transistors. See FIG. 11A and the integrated pixel and ROM cell 201A, which includes a switch 236 (e.g., an additional NFET, also referred to as an isolation FET) between the sense node 235 and the gate of the amplifying transistor 233 to control current flow to the gate of the amplifying transistor the sensing process by the photodiode is complete. See also FIG. 11B and the integrated pixel and ROM cell 201B that includes the switch 236 (described above) and another additional NFET 251, which has both a drain region and a gate electrically connected to the junction between the amplifying transistor 233 and the select transistor 250 and which has a source region connected to ground for improved performance.

Figure 12:
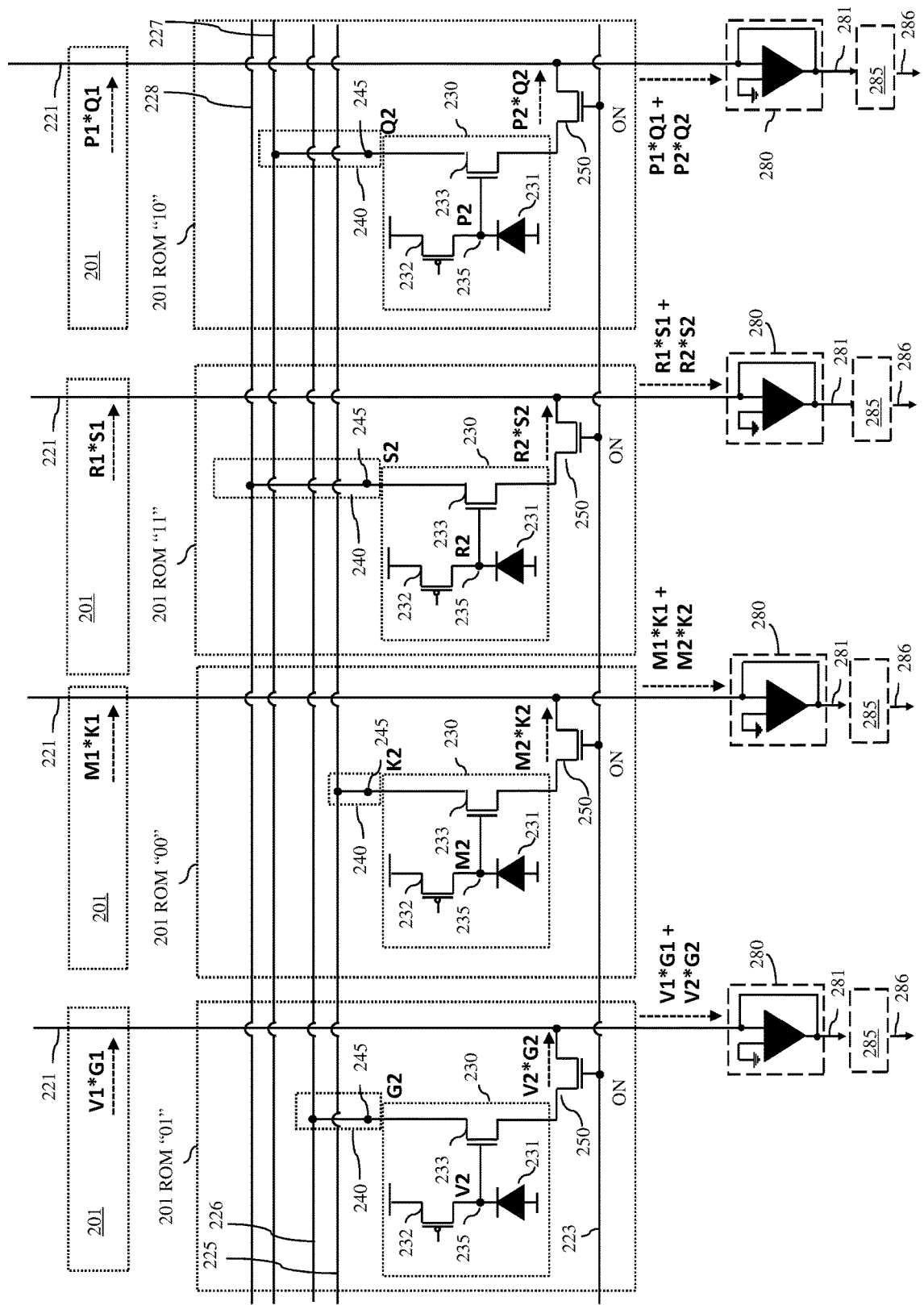
FIG. 12 is a schematic diagram illustrating another embodiment of an IC structure that includes an array of integrated pixel and ROM cells configured for deep in-sensor, in-memory computing.

In some embodiments, each integrated pixel and ROM cell could include a ROM structure that is electrically connected to one of three or more different voltage rails that arbitrarily represent different multi-bit data values, respectively, as opposed to two different voltage rails that arbitrarily represent different single-bit data values (i.e., a "1" and a "0", respectively). For example, as illustrated in FIG. 12, the ROM can be a two-bit ROM structure. Specifically, the storage node 245 of any given cell 201 could be electrically connected to one of four different voltage rails 225-228 that are charged to different voltage levels (e.g., 1V, 0.75V, 0.5V, and 0.25V), respectively, and that arbitrarily represent four different two-bit data values (e.g., "00", "01", "10", and "11"). It should be noted that FIG. 12 illustrates an array with two rows and four columns of cells. In order to avoid clutter within the figure and to allow the reader to focus on the salient aspects of the disclosed embodiment, detailed drawings of the cells in the first row have been omitted. However, it should be understood that the output of each cell will be indicative of the product of the first data value stored therein and the second data value sensed and the total change in the bit line voltage on any specific bit line in response to multiple select transistors of multiple cells in that specific column concurrently switching to the ON state following light sensing processes will be indicative of the result of a dot product computation (as shown).

In some embodiments of the IC structure, each integrated pixel and ROM cell could include a ROM structure that is electrically connected to one of multiple different voltage rails. However, the voltage signals on the different voltage rails in these embodiments could be at different pulse widths as opposed to different voltage levels (i.e., different amplitudes) that arbitrarily represent the different data values.

In some embodiments, each integrated pixel and ROM cell could include a ROM structure that is electrically connected to one of multiple different voltage rails. However, the voltage signals on the different voltage rails in these embodiments could be at different pulse widths and different voltage levels (i.e., different amplitudes) that arbitrarily represent the different data values.

Therefore, disclosed above are embodiments of an integrated circuit (IC) structure and, particularly, a processing chip, which includes an array of integrated pixel and memory cells configured for deep in-sensor, in-memory computing (e.g., of neural networks (NNs)). Specifically, each cell in the array can incorporate both a memory structure (e.g., a dynamic random access memory (DRAM) structure, a read only memory (ROM) structure or some other suitable memory structure) with a storage node, which stores a first data value (e.g., a binary weight value), and a sensor and, particularly, a photodiode, which is connected to a sense node and which outputs a second data value (e.g., an analog input value) on the sense node. Each of the cells can further be selectively operable in a functional computing mode during which the voltage level on a bit line is adjusted as a function of both the first data value and the second data value. Each of the cells can further be selectively operable in a storage node read mode. Furthermore, depending upon the type of memory structure (e.g., a DRAM structure), each cell can further be selectively operable in a storage node write mode. Also disclosed above are associated method embodiments.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
an array of cells arranged in columns and rows, wherein each cell comprises:
   a select transistor having a gate electrically connected to a word line for a row and a source region electrically connected to a bit line for a column;
   a storage node operably connected to the select transistor, wherein the storage node stores a first data value comprising a binary data value;
   a sense node operably connected to the select transistor; and
   a photodiode electrically connected to the sense node,
wherein each cell is selectively operable in a functional computing mode, and
wherein, during the functional computing mode in a specific cell within a specific row and a specific column, the photodiode of the specific cell performs a sensing process resulting in a second data value being output on the sense node and a specific word line for the specific row is activated causing the select transistor of the specific cell to switch to an ON state and a bit line voltage on a specific bit line for the specific column to be automatically adjusted as a function of both the first data value and the second data value.

2. The integrated circuit structure of claim 1, wherein each cell further comprises a pixel that incorporates the photodiode and the sense node and wherein the pixel further comprises:
   a reset transistor; and
   an amplifying transistor,
   wherein the reset transistor and the photodiode are electrically connected in series between a positive voltage rail and a ground rail,
   wherein the sense node is at a junction between the reset transistor and the photodiode, and
   wherein a gate of the amplifying transistor is electrically connected to the sense node.

3. The integrated circuit structure of claim 1, wherein each cell further comprises:
   an amplifying transistor having a gate connected to the sense node, a source, and a drain; and
   a memory structure connected to one of the source and the drain of the amplifying transistor, incorporating the storage node, and comprising any of a dynamic random access memory structure and a read only memory structure.

4. The integrated circuit structure of claim 1,
wherein any change in the bit line voltage on the specific bit line in response to the select transistor of the specific cell switching to the ON state is indicative of a product of the first data value on the storage node and the second data value on the sense node in the specific cell, and
wherein a total change in the bit line voltage on the specific bit line in response to multiple select transistors of multiple cells in the specific column switching to the ON state is indicative of a result of a dot product computation.

5. An integrated circuit structure comprising:
an array of cells arranged in columns and rows, wherein each cell comprises:
   a select transistor;
   a dynamic random access memory structure comprising a storage node operably connected to the select transistor;
   a sense node operably connected to the select transistor; and
   a photodiode electrically connected to the sense node;
first word lines, each first word line being electrically connected to gates of select transistors of all cells in a corresponding row; and
first bit lines, each first bit line being electrically connected to source regions of select transistors of all cells in a corresponding column,
wherein each cell is operable in a storage node write mode, a storage node read mode, and a functional computing mode,
wherein, during the storage node write mode in a specific cell within a specific row and a specific column, a first data value comprising a binary data value is stored on the storage node of the specific cell,
wherein, during the storage node read mode in the specific cell, the first data value is read from the storage node of the specific cell, and
wherein, during the functional computing mode in the specific cell, the photodiode of the specific cell performs a sensing process resulting in a second data value being output on the sense node and a specific word line for the specific row is activated causing the select transistor of the specific cell to switch to an ON state and a bit line voltage on a specific first bit line for the specific column to be automatically adjusted as a function of both the first data value and the second data value.

6. The integrated circuit structure of claim 5, wherein each cell further comprises a pixel that incorporates the photodiode and the sense node and wherein the pixel further comprises:
   a reset transistor; and
   an amplifying transistor,
   wherein the reset transistor and the photodiode are electrically connected in series between a positive voltage rail and a ground rail,
   wherein the sense node is at a junction between the reset transistor and the photodiode, and
   wherein a gate of the amplifying transistor is electrically connected to the sense node.

7. The integrated circuit structure of claim 6, wherein the pixel further comprises at least one additional transistor.

8. The integrated circuit structure of claim 6,
wherein each cell further comprises: a second amplifying transistor, wherein the amplifying transistor, the second amplifying transistor and the select transistor are electrically connected in series between the positive voltage rail and a first bit line,
wherein the dynamic random access memory structure further comprises an access transistor,
wherein the storage node comprises a capacitor electrically connected in series between a drain region of the access transistor and ground,
wherein a gate of the second amplifying transistor is electrically connected to a junction between the capacitor and the drain region of the access transistor, and wherein the integrated circuit structure further comprises:
second word lines, wherein each second word line is electrically connected to all gates of all access transistors in a corresponding row; and
second bit lines, wherein each second bit line is electrically connected to all source regions of all access transistors in a corresponding column.

9. The integrated circuit structure of claim 5, wherein each cell further comprises at least one additional dynamic random access memory structure.

10. The integrated circuit structure of claim 5,
wherein any change in the bit line voltage on the specific first bit line in response to the select transistor of the specific cell switching to the ON state is indicative of a product of the first data value on the storage node and the second data value on the sense node in the specific cell, and
wherein a total change in the bit line voltage on the specific first bit line in response to multiple select transistors of multiple cells in the specific column switching to the ON state is indicative of a result of a dot product computation.

11. The integrated circuit structure of claim 5, further comprising transimpedance amplifiers for the columns, respectively, wherein each specific transimpedance amplifier for each specific column has a first input electrically connected to ground, a second input electrically connected to the specific bit line of the specific column and an output electrically connected to the specific bit line for the specific column.

12. The integrated circuit structure of claim 11, further comprising analog-to-digital converters for the columns, respectively, wherein each specific analog-to-digital converter for each specific column is electrically connected to the output of the specific transimpedance amplifier.

13. An integrated circuit structure comprising:
an array of cells arranged in columns and rows, wherein each cell comprises:
a select transistor;
a read only memory structure comprising a storage node operably connected to the select transistor and storing a first data value comprising a binary data value;
a sense node operably connected to the select transistor; and
a photodiode electrically connected to the sense node;
word lines, each word line being electrically connected to gates of select transistors of all cells in a corresponding row; and
bit lines, each bit line being electrically connected to source regions of select transistors of all cells in a corresponding column,
wherein each cell is selectively operable in a storage node read mode and a functional computing mode,
wherein, during the storage node read mode in a specific cell of a specific row and a specific column, the first data value is read from the storage node of the specific cell, and
wherein, during the functional computing mode in the specific cell, the photodiode of the specific cell performs a sensing process resulting in a second data value being output on the sense node and a specific word line for the specific row is activated causing the select transistor of the specific cell to switch to an ON state and a bit line voltage on a specific bit line for the specific column to be automatically adjusted as a function of both the first data value and the second data value.

14. The integrated circuit structure of claim 13, wherein each cell further comprises a pixel that incorporates the photodiode and the sense node and wherein the pixel further comprises:
a reset transistor; and
an amplifying transistor,
wherein the reset transistor and the photodiode are electrically connected in series between a positive voltage rail and a ground rail,
wherein the sense node is at a junction between the reset transistor and the photodiode, and
wherein a gate of the amplifying transistor is electrically connected to the sense node.

15. The integrated circuit structure of claim 14, wherein the pixel further comprises at least one additional transistor.

16. The integrated circuit structure of claim 14,
wherein the read only memory structure comprises a single bit read only memory structure,
wherein the storage node is electrically connected to either a first voltage rail at a first voltage level such that the first data value is "0" or a second voltage rail at a second voltage level that is different from the first voltage level such that the first data value is a "1", and
wherein the amplifying transistor and the select transistor are electrically connected in series between the storage node and a bit line.

17. The integrated circuit structure of claim 14,
wherein the read only memory structure comprises a two-bit read only memory structure,
wherein the storage node is electrically connected to one of a first voltage rail at a first voltage level such that the first data value is "00", a second voltage rail at a second voltage level that is greater than the first voltage level such that the first data value is "01", a third voltage rail at a third voltage level that is greater than the second voltage level such that the first data value is "10" or a fourth voltage rail at a fourth voltage level that is greater than the third voltage level such that the first data value is "11", and
wherein the amplifying transistor and the select transistor are electrically connected in series between the storage node and a bit line.

18. The integrated circuit structure of claim 13,
wherein any change in the bit line voltage on the specific bit line in response to the select transistor of the specific cell switching to the ON state is indicative of a product of the first data value on the storage node and the second data value on the sense node in the specific cell, and
wherein a total change in the bit line voltage on the specific bit line in response to multiple select transistors of multiple cells in the specific column switching to the ON state is indicative of a result of a dot product computation.

19. The integrated circuit structure of claim 13, further comprising transimpedance amplifiers for the columns, respectively, wherein each specific transimpedance amplifier for each specific column has a first input electrically connected to ground, a second input electrically connected to the specific bit line of the specific column and an output electrically connected to the specific bit line for the specific column.

20. The integrated circuit structure of claim 19, further comprising analog-to-digital converters for the columns, respectively, wherein each specific analog-to-digital converter for each specific column is electrically connected to the output of the specific transimpedance amplifier.

\* \* \* \* \*